(12) United States Patent
Kim et al.

(10) Patent No.: US 7,541,279 B2
(45) Date of Patent: Jun. 2, 2009

(54) METHOD FOR MANUFACTURING SEMICONDUCTOR DEVICE

(75) Inventors: Sang Chul Kim, Busan (KR); Jae Won Han, Suwon-si (KR)

(73) Assignee: Dongbu Electronics Co., Ltd, Seoul (KR)

( * ) Notice: Subject to any disclaimer, the term of this patent is extended or adjusted under 35 U.S.C. 154(b) by 157 days.

(21) Appl. No.: 11/615,105

(22) Filed: Dec. 22, 2006

(65) Prior Publication Data

US 2007/0148967 A1  Jun. 28, 2007

(30) Foreign Application Priority Data

Dec. 28, 2005  (KR) .................. 10-2005-0132329

(51) Int. Cl.
*H01L 21/20* (2006.01)
(52) U.S. Cl. .................. 438/625; 438/627; 438/629; 438/633; 438/637; 438/687; 257/E21.174; 257/E21.175; 257/E21.526; 257/E21.583; 257/E21.585
(58) Field of Classification Search .................. 438/637, 438/625, 627, 629, 633, 653, 654, 677, 687; 257/E21.174, 175, 526, 583, 585
See application file for complete search history.

(56) References Cited

U.S. PATENT DOCUMENTS

| | | | | |
|---|---|---|---|---|
| 5,225,771 A | * | 7/1993 | Leedy | .................. 324/757 |
| 6,113,771 A | * | 9/2000 | Landau et al. | .................. 205/123 |
| 6,284,652 B1 | * | 9/2001 | Charneski et al. | .................. 438/653 |
| 6,328,871 B1 | * | 12/2001 | Ding et al. | .................. 205/183 |
| 6,696,758 B2 | * | 2/2004 | Dubin et al. | .................. 257/E23.161 |
| 6,903,011 B2 | * | 6/2005 | Liu et al. | .................. 438/642 |
| 2004/0256351 A1 | * | 12/2004 | Chung et al. | .................. 216/13 |
| 2006/0234508 A1 | * | 10/2006 | Shirakashi et al. | .................. 438/691 |
| 2007/0293039 A1 | * | 12/2007 | Bu et al. | .................. 438/627 |

* cited by examiner

*Primary Examiner*—Michael S Lebentritt
(74) *Attorney, Agent, or Firm*—Saliwanchik, Lloyd & Saliwanchik

(57) ABSTRACT

A method for manufacturing a semiconductor device is provided. The method includes the steps of forming an interlayer insulating layer on a semiconductor substrate, selectively patterning the interlayer insulating layer to form a contact hole, depositing a first metal on an inner surface of the contact hole, submerging the semiconductor substrate on which the first metal is deposited into an electrochemical plating (ECP) solution bath in which a second metal is dissolved, dissolving the first metal in the ECP solution bath, plating the first and second metals dissolved in the ECP solution bath at the same time to gap-fill an alloy of the first and second metals in the contact hole, and removing the alloy using the interlayer insulating layer as an end point in a CMP process to form an alloy interconnection.

11 Claims, 3 Drawing Sheets

METHOD FOR MANUFACTURING SEMICONDUCTOR DEVICE

RELATED APPLICATION(S)

This application claims priority under 35 U.S.C. §119(e) of Korean Patent Application No. 10-2005-0132329 filed Dec. 28, 2005, which is incorporated herein by reference in its entirety.

FIELD OF THE INVENTION

The present invention relates to a method for manufacturing a semiconductor device. More particularly, the present invention relates to a method for forming a metal interconnection.

BACKGROUND OF THE INVENTION

Recent developments in the semiconductor integrated circuits have made a demand for an interconnection replacing the conventional aluminum (Al)-based interconnection. In particular, a resistance-capacitance (RC) delay caused by an interconnection due to the miniaturization of semiconductor integrated circuits has increased relative to that caused by a semiconductor device, particularly a transistor. Further, as interconnection resistance increases in connection with the miniaturization of an interconnection width, studies are being made to replace the Al-based interconnection.

This increase of the interconnection resistance causes a voltage drop of a power line, and increases the density of current flowing through the interconnection, thereby degrading electrical reliability of the semiconductor device. Therefore there is a tendency to replace the Al-based interconnection with a copper (Cu)-based interconnection. Cu has good conductivity and low resistance, and thus is suitable for the interconnection material.

Unlike the Al interconnection, the Cu interconnection is patterned using a damascene process, particularly a dual damascene process where the filling a contact hole and the formation of an interconnection are performed at the same time.

The dual damascene process typically includes a process of etching a trench having a depth from 4000 Å to 5000 Å, a process of filling the trench with Cu using an electrochemical plating (ECP) process, a process of removing Cu overfill using a chemical mechanical polishing (CMP) process.

Hereinafter, a conventional method for forming an interconnection of a semiconductor device will be described with reference to the accompanying drawings.

FIGS. 1A, 1B and 1C are front sectional views illustrating a processes of a conventional method for forming an interconnection of a semiconductor device.

According to the conventional method, as illustrated in FIG. 1A, first, a semiconductor substrate 601 having a transistor (not shown) is deposited with Cu, and is patterned to form a first Cu interconnection 603.

A silicon nitride layer, a silicon oxide layer, or a combination thereof is formed on a top surface of the semiconductor substrate 601 including the first Cu interconnection 603, thereby forming an insulating layer 604. Then, the insulating layer 604 is selectively removed by a dual damascene process, thereby forming a via hole 615 and a trench 614. Then, the formed pattern is baked.

Next, referring to FIG. 1B, a barrier layer 606 is formed on inner walls of the via hole 615 and the trench 614 to a thin thickness. A Cu seed layer 602 is deposited on the barrier layer 606. The Cu seed layer is required to perform an ECP process of Cu used for gap-filling Cu in the damascene process.

During the ECP process, the Cu seed layer 602 continues to be rapidly grown, thereby overfilling the via hole 615 and the trench 614 with a Cu layer 605.

Finally, after the Cu deposition is completed by the ECP process, as illustrated in FIG. IC, a CMP process is performed on a top surface of the substrate using a top surface of the insulating layer 604 as an end point. Thereby, a Cu plug 605a and a second Cu interconnection 605b are simultaneously formed in the via hole 615 and the trench 614.

However, the conventional method for forming an interconnection of a semiconductor device has the following disadvantages.

The Al interconnection has been recently replaced by the Cu interconnection. This improves electro-migration (EM) and stress migration (SM), and is favorable from the viewpoint of RC delay and process simplification. However, because Cu a has weak hardness, the CMP process causes scratch, dishing and erosion.

In particular, it is necessary to control surface scratch of the Cu interconnection caused by the CMP process, because the surface scratch has a possibility to cause contact failure when the Cu interconnection is in contact with an upper layer thereof.

A Cu—Al alloy can be used instead of soft, pure Cu to increase the hardness, so that the scratch, dishing and erosion can be reduced in the CMP process, and the EM and SM characteristics of a gradually narrowed interconnection can be improved.

However, it is difficult to deposit Al using the ECP process used to deposit Cu. As such, Al is deposited by physical vapor deposition (PVD) or chemical vapor deposition (CVD). For this reason, the conventional method has difficulty in using the Cu—Al alloy.

BRIEF SUMMARY

Accordingly, the present invention is directed to a method for forming an interconnection of a semiconductor device, in which the interconnection is formed using a copper-aluminum alloy so as to improve electrical characteristics as well as hardness of the interconnection. Embodiments of the present invention can provide a method in which aluminum is deposited using physical vapor deposition (PVD) or chemical vapor deposition (CVD) at a thin thickness, and then copper is deposited using electro-chemical plating (ECP) in order to form a copper-aluminum alloy.

According to a first embodiment of the present invention, a method for manufacturing a semiconductor device can include: forming an interlayer insulating layer on a semiconductor substrate; selectively patterning the interlayer insulating layer to form a contact hole; depositing a first metal on an inner surface of the contact hole; submerging the semiconductor substrate on which the first metal is deposited into an electrochemical plating (ECP) solution bath in which a second metal is dissolved; dissolving the first metal in the ECP solution bath; plating the first and second metals dissolved in the ECP solution bath at the same time to gap-fill an alloy of the first and second metals in the contact hole; and removing the alloy by adopting the interlayer insulating layer as an end point to form an alloy interconnection.

According to a second embodiment of the present invention, a method of forming a metal interconnection can include: forming an interlayer dielectric layer on a substrate having a predetermined pattern; selectively etching the interlayer dielectric layer, thereby forming a contact hole for exposing a device; forming a barrier metal layer on the interlayer dielectric layer including the contact hole; heat-treating the substrate in a nitrogen atmosphere; forming tungsten on the barrier metal layer including the contact hole; and performing a chemical mechanical polishing with respect to the tungsten until the interlayer dielectric layer is exposed.

According to another embodiment of the present invention, a method for manufacturing a semiconductor device, in which an aluminum-copper alloy interconnection can be formed using a first metal as aluminum and a second metal as copper, can include forming an interlayer insulating layer on a semiconductor substrate; selectively patterning the interlayer insulating layer to form a contact hole; depositing aluminum on an inner surface of the contact hole; submerging the semiconductor substrate on which aluminum is deposited into an electro-chemical plating (ECP) solution bath in which copper is dissolved, dissolving aluminum in the ECP solution bath; plating aluminum and copper dissolved in the ECP solution bath at the same time to gap-fill a copper-aluminum alloy in the contact hole; and removing the copper-aluminum alloy using the interlayer insulating layer as an end point to form a copper-aluminum alloy interconnection.

DETAILED DESCRIPTION OF THE PREFERRED EMBODIMENTS

Hereinafter, a method for manufacturing a semiconductor device in accordance with preferred embodiments of the present invention will be described in detail with reference to the accompanying drawings.

FIGS. 2A to 2H are sectional views illustrating processes of a method for forming an interconnection of a semiconductor device according to an embodiment of the present invention.

Herein, a semiconductor substrate is adapted to form various elements such as a transistor for forming a semiconductor device, and to form an interconnection by means of a copper (Cu)-aluminum (Al) alloy.

Figure 1A:
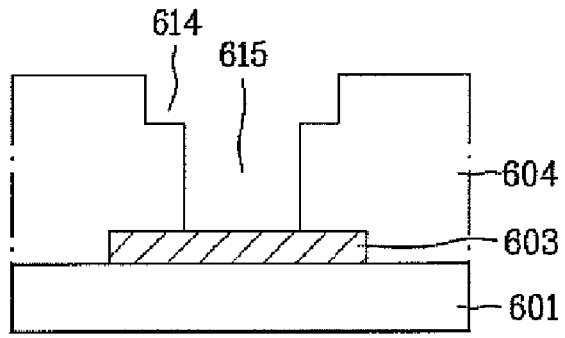
FIGS. 1A, 1B and 1C are front sectional views illustrating processes of a conventional method for forming an interconnection of a semiconductor device.
Figure 1B:
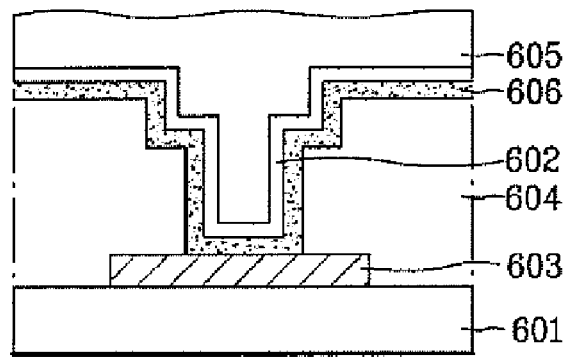
Figure 1C:
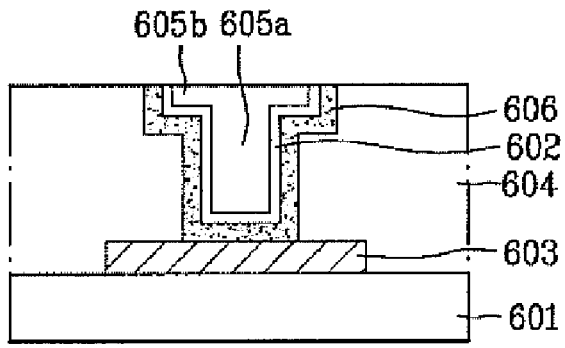
Figure 2A:
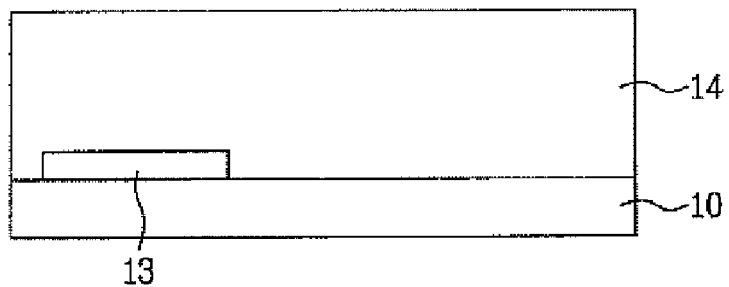
FIGS. 2A to 2H are sectional views illustrating processes of a method for forming an interconnection of a semiconductor device according to an embodiment of the present invention.
Figure 2B:
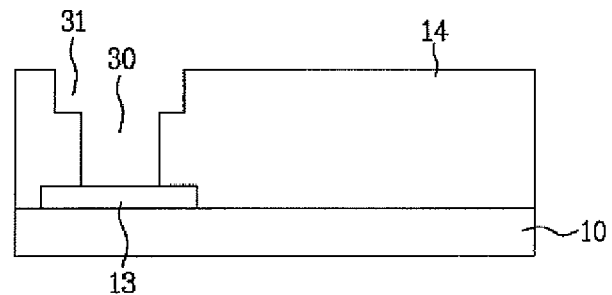
Figure 2C:
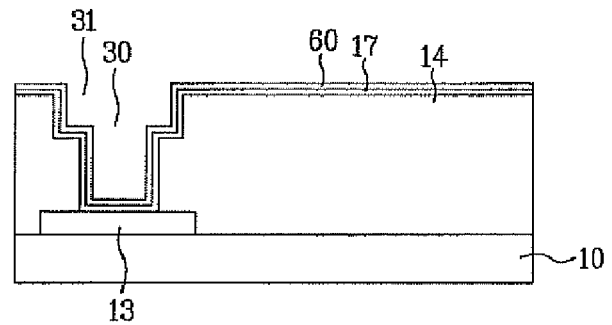

As for the interconnection of the semiconductor device according to an embodiment of the present invention, first, as illustrated in FIG. 2A, in one embodiment, a material such as Cu can be deposited on a semiconductor substrate 10 by means of sputtering, and then can be patterned by a photolithography process and an etching process, thereby forming a lower interconnection 13.

Silicon oxide or a low-k material can be deposited on a top surface of the semiconductor substrate including the lower interconnection 13 at a thick thickness, thereby forming an interlayer insulating layer 14. Then, referring to in FIG. 2B, the interlayer insulating layer 14 can be selectively removed by a dual damascene process to form a via hole 30 and a trench 31.

Here, the dual damascene process can be employed to form the via hole 30 and the trench 31 using a photo-etching process. More specifically, the via hole 30 can be formed, and then the upper portion of the surrounding region can be selectively removed to form the trench 31. Alternately the trench 31 can be formed, and then the via hole 30 is formed in the trench to be narrower than the trench 31.

Next, a surface of the lower interconnection 13 can be cleaned by a cleaning process using radio-frequency (RF) sputtering or hydrogen reduction. Then, referring to FIG. 2C, a barrier layer 17 of, for example, tantalum (Ta) or tantalum nitride (TaN) can be formed on the top surface of the semiconductor substrate 10 including the via hole 30 and the trench 31.

An Al layer 60 can be formed on the top surface of the semiconductor substrate 10 including the barrier layer 17 using PVD or CVD.

Figure 2D:
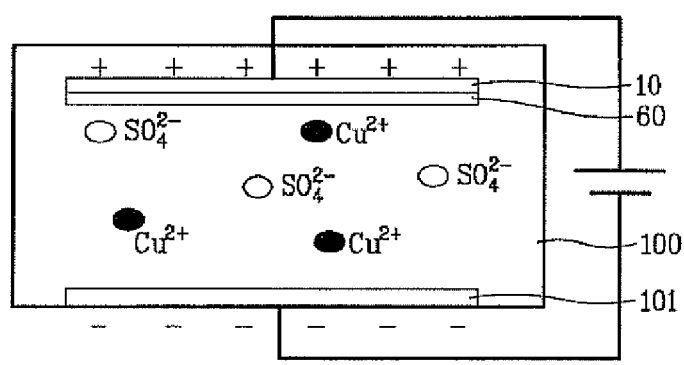

Afterwards, as illustrated in FIG. 2D, the semiconductor substrate 10 having the Al layer 60 can be submerged into an ECP solution bath 100. The ECP solution bath 100 contains an electrolytic solution, and is provided with first and second electrodes (not shown), which are opposite to each other at a predetermined interval. An electrolytic solution such as copper sulfate ($CuSO_4$) and a Cu plate 101 connected to the electrode can be used as a copper source for Cu plating. In a specific embodiment, the copper sulfate can be ionized into $Cu^{2+}$ and $SO_4^{2-}$. The semiconductor substrate 10 is connected to the first electrode, whereas the Cu plate is connected to the second electrode.

Figure 2E:
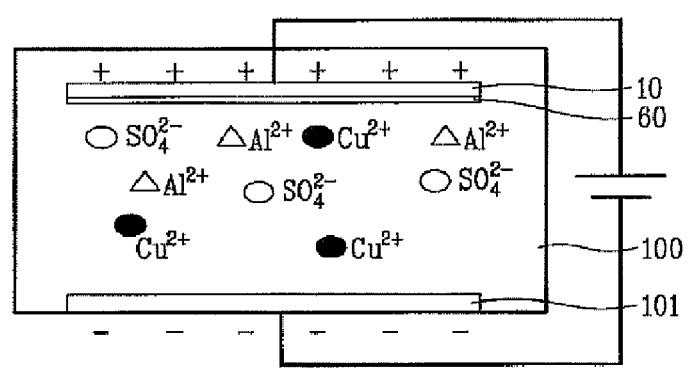

Then, as illustrated in FIG. 2E, a positive voltage can be applied to the first electrode connected to the semiconductor substrate 10, and a negative voltage can be applied to the second electrode connected to the Cu plate 101. Thereby, Al of the Al layer 60 of the semiconductor substrate 10 is ionized into $Al^{2+}$, and then is sufficiently dissolved into the electrolytic solution in the ECP solution bath 100. Therefore, the ions of $Cu^{2+}$, $SO_4^{2-}$, and $Al^{2+}$ are mixed together in the electrolytic solution in the ECP solution bath 100.

Figure 2F:
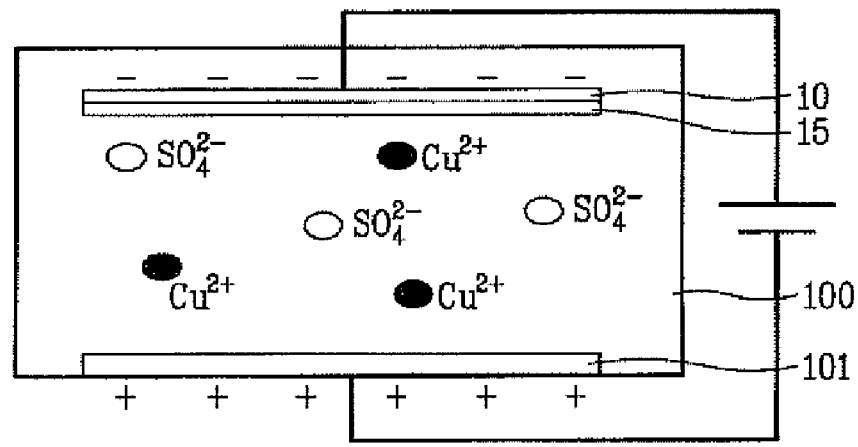

Subsequently, as illustrated in FIG. 2F, a negative voltage can be applied to the first electrode connected to the semiconductor substrate 10, and a positive voltage can be applied to the second electrode connected to the Cu plate 101. The cations of $Cu^{2+}$ and $Al^{2+}$ are attached to the semiconductor substrate 10 at the same time, thereby resulting in plating the semiconductor substrate 10 with a Cu—Al alloy. At this time, when the Cu ions are depleted in the electrolytic solution, Cu of the Cu plate 101 is reduced, and thus is dissolved into the electrolytic solution in the LECP solution bath 100.

Then, when the Cu—Al alloy continues to be plated during the ECP process, the Cu—Al alloy 15 is overfilled in the trench 31 and via hole 30.

Figure 2G:
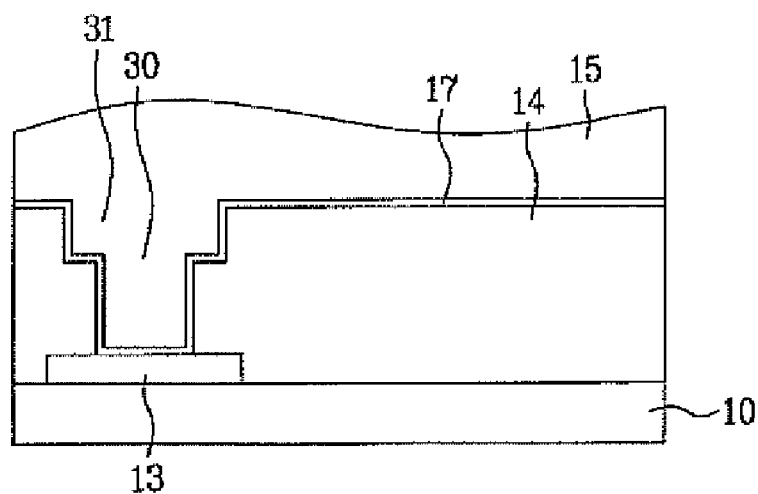
Figure 2H:
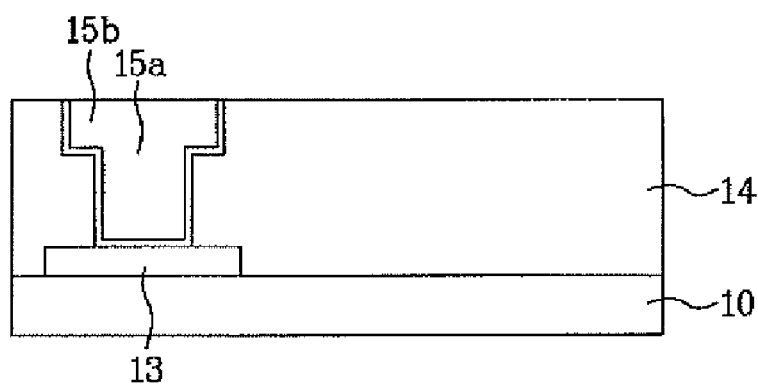

In this manner, after the Cu—Al alloy 15 sufficiently overfills the trench 31 and via hole 30 as illustrated in FIG. 2G, the top surface of the resulting semiconductor substrate can be planarized by a CMP process using a top surface of the interlayer insulating layer 14 as an end point. Accordingly, the overfill of the Cu—Al alloy can be removed as seen in FIG. 2H.

In an embodiment the CMP process can be performed by placing the overfilled surface of the Cu—Al alloy in contact with the surface of a polishing pad, rotating the Cu—Al alloy and the polishing pad in opposite directions to each other, physically polishing the overfilled surface of the Cu—Al alloy, chemically reacting the overfilled surface of the Cu—Al alloy by supplying a slurry in which an abrasive is dispersed at the same time, and planarizing the top surface of the semiconductor substrate. At this time, because the polished metal layer is the Cu—Al alloy interconnection having hardness higher than that of the Cu interconnection, defects such as scratch, dishing, and erosion can be reduced in the CMP process.

Therefore a Cu—Al alloy plug 15*a* can be formed in the via hole 30, and simultaneously a Cu—Al alloy interconnection 15*b* can be formed in the trench 31.

It will be apparent to those skilled in the art that various modifications and variations can be made in the present invention. Thus, it is intended that the present invention covers the modifications and variations of this invention provided they come within the scope of the appended claims and their equivalents.

As described above, the method for forming an interconnection of a semiconductor device according to the present invention has the following effects.

First, the conventional Al deposition employs PVD, and the conventional Cu deposition employs ECP. Because of the difficulty in depositing Al by means of ECP, the Cu—Al alloy is not conventionally used. However, the present invention employs a dual deposition method in which Al is deposited at a thin thickness using PVD or CVD, and then Cu is deposited using the ECP, so that it can apply the Cu—Al alloy to the interconnection.

Second, the Cu—Al alloy interconnection can be formed, and thereby the hardness of the interconnection can be improved. Thus, the vulnerabilities of the EM and SM caused by the relative increase of a Cu grain size at the narrow interconnection can be reduced by mixture of Al and Cu, so that a synergy effect can be expected from the viewpoint of reliability.

Third, the metal layer of the present invention includes a Cu—Al alloy interconnection having hardness higher than that of the Cu interconnection, so that the defects such as scratch, dishing, and erosion can be reduced in the CMP process in which the overfilled metal layer is planarized to form the interconnection.

It should be understood that the examples and embodiments described herein are for illustrative purposes only and that various modifications or changes in light thereof will be suggested to persons skilled in the art and are to be included within the spirit and purview of this application.

We claim:

1. A method for manufacturing a semiconductor device, comprising:

forming an interlayer insulating layer on a semiconductor substrate;

selectively patterning the interlayer insulating layer to form a contact hole;

depositing aluminum (Al) on an inner surface of the contact hole;

submerging the semiconductor substrate on which the aluminum is deposited into an electro-chemical plating (ECP) solution bath in which copper (Cu) is dissolved;

dissolving the aluminum in the ECP solution bath;

plating the aluminum and copper dissolved in the ECP solution bath at the same time to gap-fill a copper-aluminum alloy in the contact hole; and removing a portion of the copper-aluminum alloy using the interlayer insulating layer as an end point to form a copper-aluminum alloy interconnection.

2. The method according to claim 1, wherein the ECP solution bath comprises first and second electrodes that arc spaced apart from each other in an electrolytic solution at a predetermined interval.

3. The method according to claim 2, wherein the electrolytic solution contains copper sulfate ($CuSO_4$).

4. The method according to claim 2, wherein the first electrode is connected to a copper plate, and the second electrode is connected to the semiconductor substrate.

5. The method according to claim 4, wherein dissolving the aluminum in the ECP solution bath comprises applying a positive voltage to the first electrode and applying a negative voltage to the second electrode.

6. The method according to claim 4, wherein plating the aluminum and copper dissolved in the ECP solution bath at the same time comprises applying a negative voltage to the first electrode and applying a positive voltage to the second electrode.

7. The method according to claim 1, wherein removing a portion of the copper-aluminum alloy using the interlayer insulating layer as an end point comprises performing a chemical mechanical polishing (CMP) process.

8. The method according to claim 1, further comprising forming a barrier layer on the inner surface of the contact hole prior to the step of depositing the aluminum on an inner surface of the contact hole.

9. The method according to claim 1, wherein the aluminum is deposited physical vapor deposition (PVD) or chemical vapor deposition (CVD).

10. The method according to claim 1, wherein the contact hole comprises a trench and a via hole.

11. The method according to claim 1, wherein selectively patterning the interlayer insulating layer to form a contact hole comprises performing a dual damascene process to form a trench and a via hole.

* * * * *